United States Patent
Yeh et al.

(10) Patent No.: US 7,358,537 B2
(45) Date of Patent: Apr. 15, 2008

(54) LIGHT EMITTING DIODE AND FABRICATION METHOD THEREOF

(75) Inventors: Wen-Yung Yeh, Hsinchu (TW);
Jenq-Dar Tsay, Taipei (TW);
Chang-Cheng Chuo, Changhua (TW);
Jung-Tsung Hsu, Hsinchu (TW);
Jim-Yong Chi, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 350 days.

(21) Appl. No.: 11/069,567

(22) Filed: Mar. 2, 2005

(65) Prior Publication Data
US 2005/0221527 A1    Oct. 6, 2005

(30) Foreign Application Priority Data
Mar. 19, 2004    (TW) .............................. 93107439 A

(51) Int. Cl.
*H01L 29/22* (2006.01)
(52) U.S. Cl. .............................. 257/95; 257/94; 257/98
(58) Field of Classification Search ................. 257/79, 257/94, 91, 95, 98, 13
See application file for complete search history.

(56) References Cited

U.S. PATENT DOCUMENTS

| 5,779,924 | A | * | 7/1998 | Krames et al. | ............... 216/24 |
| 6,133,589 | A | | 10/2000 | Krames et al. | |
| 6,229,160 | B1 | | 5/2001 | Krames et al. | |
| 6,258,618 | B1 | | 7/2001 | Lester | |
| 6,323,063 | B2 | | 11/2001 | Krames et al. | |
| 6,969,627 | B2 | * | 11/2005 | Pan et al. | ...................... 438/39 |
| 6,987,613 | B2 | * | 1/2006 | Pocius et al. | ................... 257/98 |

OTHER PUBLICATIONS

M.R. Krames et al., Applied Physics Letters vol. 75, No. 16, Oct. 18, 1999, pp. 2365-2367.

* cited by examiner

*Primary Examiner*—Kevin M Picardat
(74) *Attorney, Agent, or Firm*—Birch, Stewart, Kolasch & Birch, LLP

(57) ABSTRACT

A light emitting diode (LED). The LED comprises a LED chip comprising an n-type semiconductor layer, a active layer and a p-type semiconductor layer. An n-type ohmic contact electrode and a p-type ohmic contact electrode electrically contact the n-type semiconductor layer and the p-type semiconductor layer respectively. An AlGaInN thick film is on the LED chip, and the AlGaInN thick film has an oblique side and a textured top surface.

19 Claims, 13 Drawing Sheets

LIGHT EMITTING DIODE AND FABRICATION METHOD THEREOF

BACKGROUND OF THE INVENTION

1. Field of the Invention

The invention relates to a light emitting diode (LED), and more particularly to a LED having a special structure and fabrication method thereof.

Light emitting diodes (LEDs) are well known solid state devices that can generate light having a peak wavelength in a specific region of the light spectrum. LEDs are typically used as illuminators, indicators and displays.

2. Brief Discussion of the Related Art

FIG. 1 shows a conventional LED structure, comprising substrate 10, LED chip 20, n-type ohmic contact electrode 30 and p-type ohmic contact electrode 40. The LED chip 20 comprises n-type semiconductor 21, active layer 22 and p-type semiconductor 23. The n-type and p-type ohmic contact electrodes 30 and 40 contact the n-type and p-type semiconductor layers 21 and 23 electrically. The light emitting surface is the top surface of the LED chip 20, as shown in FIG. 1. In this LED structure, n-type and p-type ohmic contact electrodes 30 and 40 are on the LED chip 20 top surface, such that emitted light is covered by the n-type and p-type ohmic contact electrodes 30 and 40, resulting in decreased LED luminescent efficiency.

Furthermore, the n-type contact electrodes 30 can be disposed on the substrate 10 bottom surface, as shown in FIG. 2. However, the emitting light is still covered by the p-type ohmic contact electrode 40, and the substrate 10 must be conductive material such that the n type semiconductor layer 21 is in electrical contact with the p type semiconductor layer 30.

The above-mentioned problem can be addressed by a flip chip, as shown in FIG. 3. The flip chip is an inverted FIG. 1 LED structure, wherein the n-type and p-type ohmic contact electrodes 30 and 40 are in the bottom position and the substrate 10, acting as light emitting surface is in the top position. As the substrate is transparent and without any shelter thereon, the p type reflective layer reflects light upward, thus improving luminescent efficiency of the LED.

Additionally, the extraction efficiency of semiconductor light emitting devices (LEDs) is limited by the high contrast between the optical refractive indices of semiconductor materials (about 2.2-3.6) and that of the surrounding media, typically air (about 1.0) or optically transparent epoxy (about 1.5). This large difference, in refractive indices causes photons within the device to have a high probability of being totally-internally-reflected when impinging on interfaces between the semiconductor and the ambient media. As the conventional LED is typically cubic, which surfaces are parallel to one another, lights with reflective angle larger than the critical angle would totally-internally-reflect within the LED and were absorbed by the active region or defects rather than refract out, thus decreasing luminescent efficiency of the LED.

To decrease the total-internal-reflection problem, a truncated inverted pyramid LED (TIP LED) and a surface texture structure has seem provided. To solve above problem, HP developed a truncated inverted pyramid LED (TIP LED) by cutting sides of the LED chip to be non-parallel, and thus light emits out of the chips more efficiently. Such a TIP LED is disclosed in M. R. Krames et al., Appli. Phys. Lett. 75(16),2365, 1999, U.S. Pat. No. 6,229,160 and U.S. Pat. No. 6,323,063. However, this technique can only apply for easy-processing (e.g. cutting) materials, such as AlGaInP/GaP. The most popular white LED is GaN LED with sapphire substrate, which is too hard to cut, however. Accordingly, the above method cannot apply to GaN white LED for improving luminescent efficiency. CREE employs SiC substrate, which is easier to cut than sapphire substrate, to form a TIP LED, as disclosed in Compound Semiconductor, 7(1), 7, 2001. However, GaN and SiC have lattice-mismatch problems, and SiC has increased absorption coefficient in short wavelengths, which decreases luminescent efficiency.

Surface texture structures have the same problem as TIP LED, and texturing steps may dip through the substrate to decrease LED performance. In U.S. Pat. No. 6,133,589, the epitaxy is grown on a textured surface of a sapphire or AlGaInP substrate. When light reaches the textured surface, it changes direction such that the emission efficiency increases. However, the sapphire substrate surface is difficult to texture, and although the AlGaInP substrate surface can be textured, the epitaxy quality deteriorates.

Furthermore, in U.S. Pat. No. 6,258,618, the textured-surface is formed on the p type semiconductor layer. However, this makes the surface of the p type semiconductor layer uneven, thus increasing the resistance. In addition, the p type semiconductor layer is typically not thick enough to avoid digging through when texturing the same. As a result, the electron-hole surface recombination in the luminescent zone of the luminescent layer decreases, negatively affecting the performance. In addition, in Compound Semiconductor January 2002 to Schmid and Windisch et al., an electrode is positioned between the carrier layer and semiconductor layer by wafer bonding, and a light-emitting surface without electrode is formed by the lift-off method. The light-emitting surface is than textured to increase luminescent efficiency. Although this method can solve the high resistance problem due to uneven surface of the p type semiconductor layer, the digging through issue is still a concern when texturing. An addition support layer is therefore needed, which complicates the fabrication process, however. Accordingly, it is desirable to solve the above problems and provide a LED and fabrication method thereof with improved luminescent efficiency.

SUMMARY OF THE INVENTION

A LED and a fabrication method are provided.

An embodiment of a LED is provided. The LED comprises a LED chip comprising an n-type semiconductor layer, a active layer and a p-type semiconductor layer. An n-type ohmic contact, electrode and a p-type ohmic contact electrode electrically contact the n-type semiconductor layer and the p-type semiconductor layer respectively. An AlGaInN thick film is on the LED chip, and the AlGaInN thick film has an oblique side and a textured top surface.

An embodiment of a LED fabrication method is provided. The method comprises providing a substrate and forming a first pattern on the substrate. A AlGaInN thick film with an oblique side is formed on the first pattern by a epitaxy method, and the AlGaInN thick film has a first flat surface. A LED chip is formed on the first flat surface, and the LED chip comprises an n-type semiconductor layer, an active layer and a p-type semiconductor layer. An n-type ohmic contact electrode and a p-type ohmic contact electrode are formed on the n-type semiconductor layer and the p-type semiconductor layer respectively. The above-mentioned structure is inverted. The substrate is removed to expose a second flat surface of the AlGaInN thick film. The second flat surface is textured to form a textured surface.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
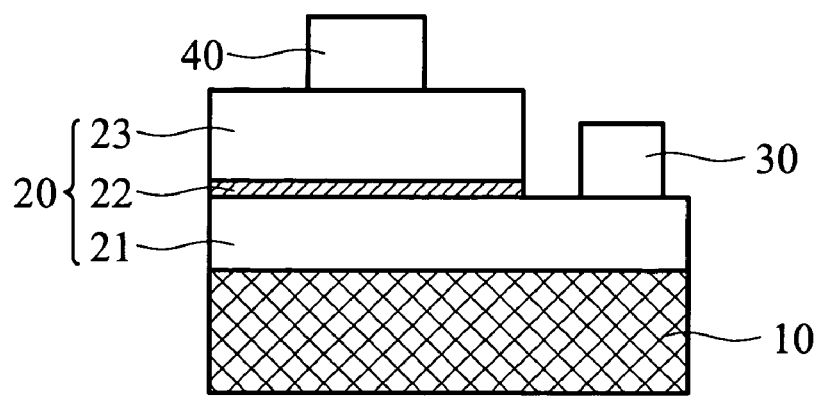
FIGS. 1~3 are cross-sections of a conventional LED structure.
Figure 2:
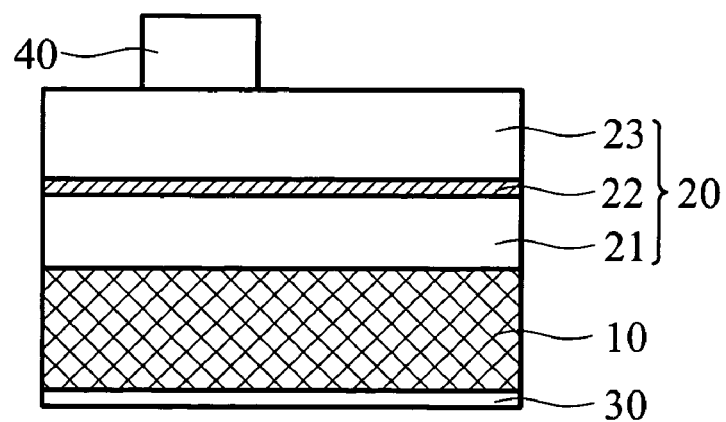
Figure 3:
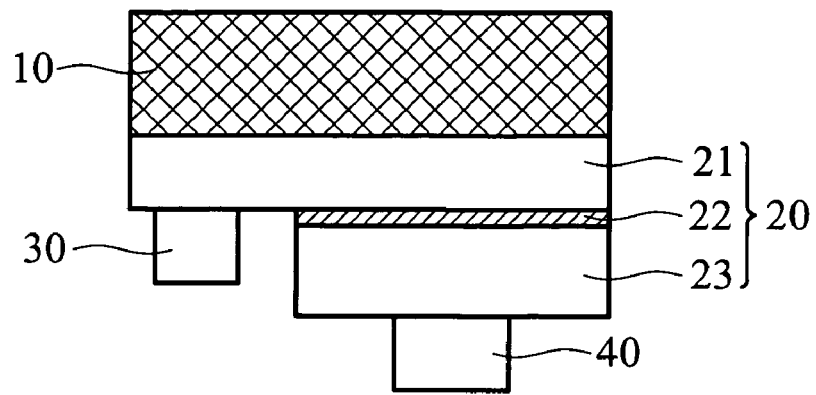

The present disclosure may repeat reference numerals and/or letters in the various examples. This repetition is for purpose of simplicity and clarity and doesn't in itself dictate a relationship between the various embodiments and/or configuration discussed.

Figure 4:
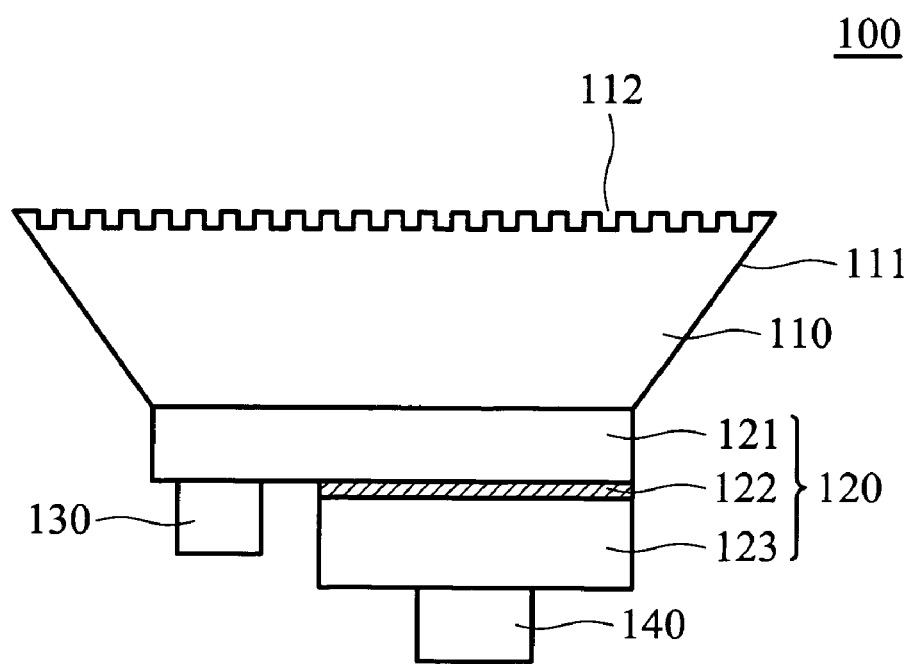
FIG. 4 is a cross-section of a LED structure of the present invention.
Figure 5A:
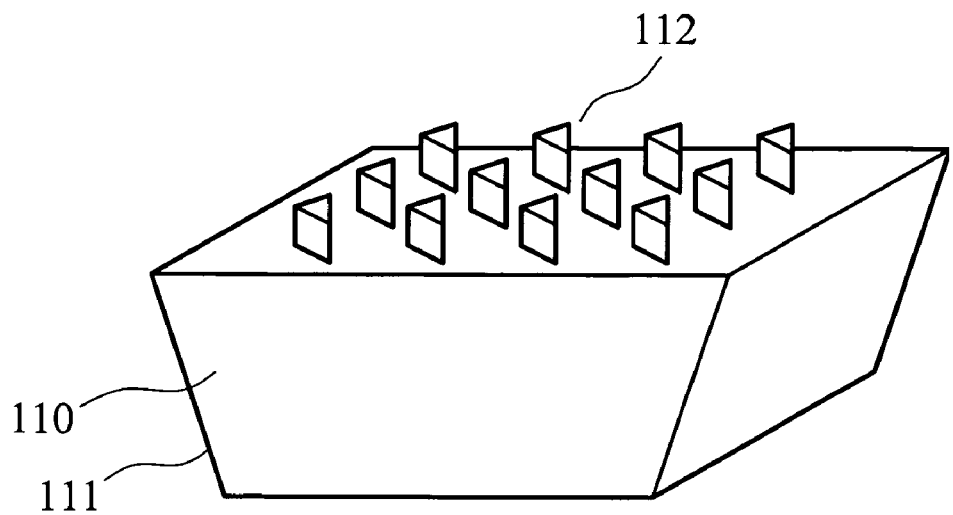
FIGS. 5A~5D are side views of a textured top surface of an AlGaInN thick film according to the LED of the present invention.
Figure 5B:
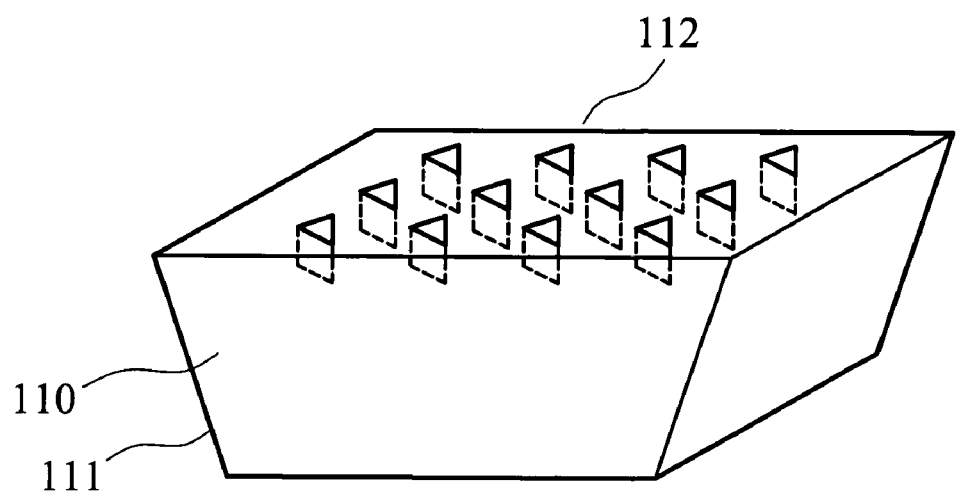
Figure 5C:
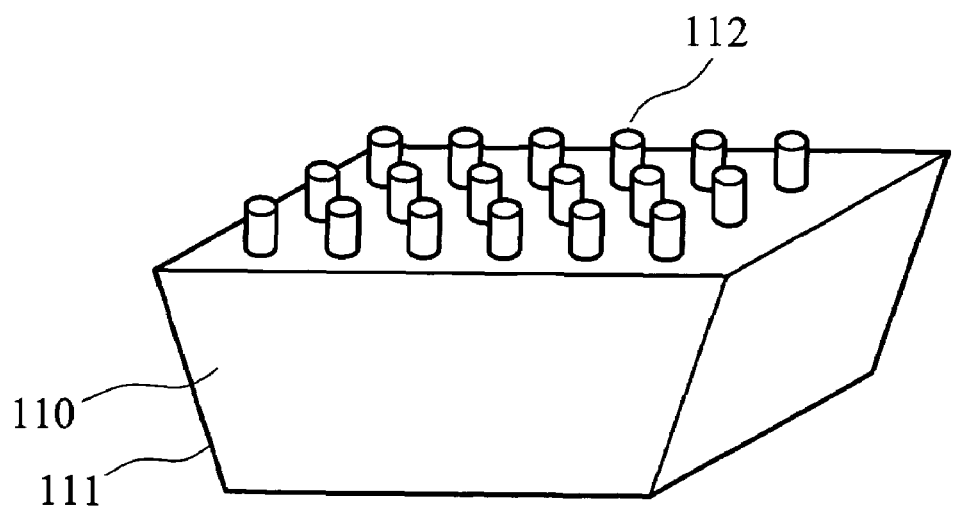
Figure 5D:
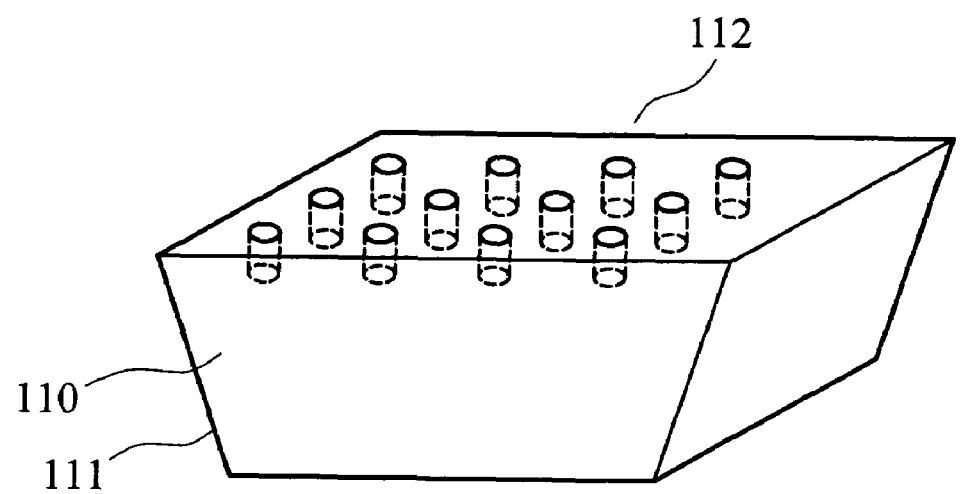

The LED of the present invention is shown in FIG. 4. The LED 100 comprises AlGaInN thick film 110 and LED chip 120. The LED chip 120 comprises n-type semiconductor layer 121, an active layer 122 and a p-type semiconductor layer 123. N-type ohmic contact electrode 130 and p-type ohmic contact electrode 140 electrically contact the n-type semiconductor layer 121 and p-type semiconductor layer 123 respectively. The AlGaInN thick film 110 is on the LED chip 120. The AlGaInN thick film 110 has oblique side 111 and textured top surface 112, and this is the key feature of the present invention.

The AlGaInN thick film 110 consists of $Al_xGa_{(1-X-Y)}In_YN$, wherein $0 \leq X$, $Y<1$, $0 \leq X+Y<1$, and X, Y are no fixed value. The AlGaInN thick film 110 is thicker than 20 μm, preferably 20~100 μm, thicker than conventional LED GaN layers, so called AlGaInN "thick" film 110. This thick film prevents deep surface textures form perforating the layer and increasing light window size. The AlGaInN thick film 110 internal diameter exceeds 150 μm, preferably 200~1000 μm. The bottom shape of the AlGaInN thick film 110 is a polygon (such as quadrangle or hexagon), circle or ellipse. The included angle between AlGaInN thick film 110 bottom and oblique side is about 43~62°.

Figure 6A:
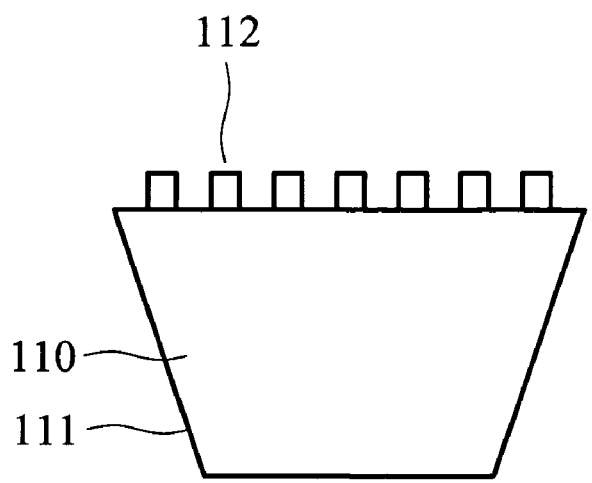
FIGS. 6A~6H are cross-sections of a textured top surface of an AlGaInN thick film according to the LED of the present invention.
Figure 6B:
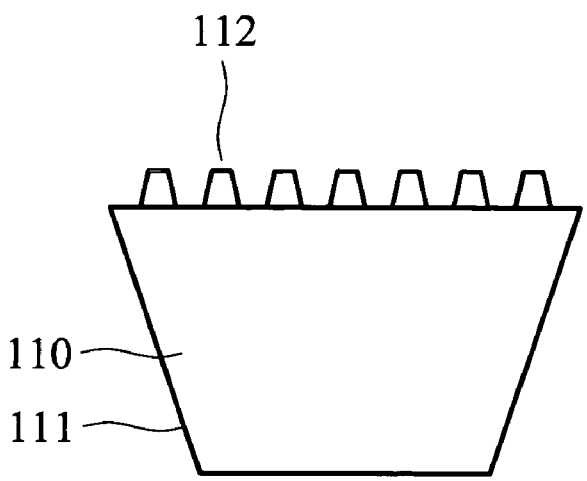
Figure 6C:
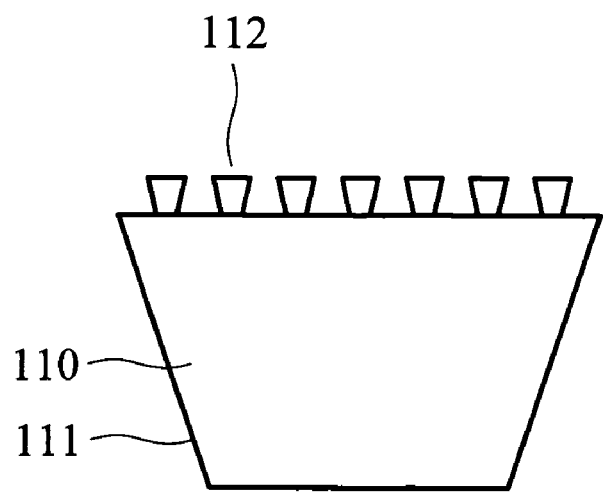
Figure 6D:
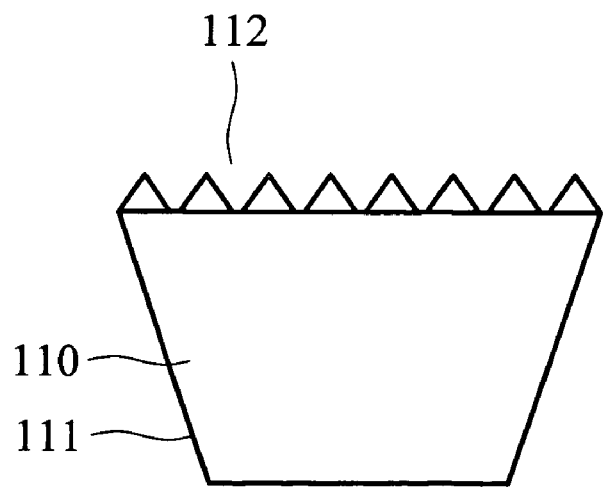
Figure 6E:
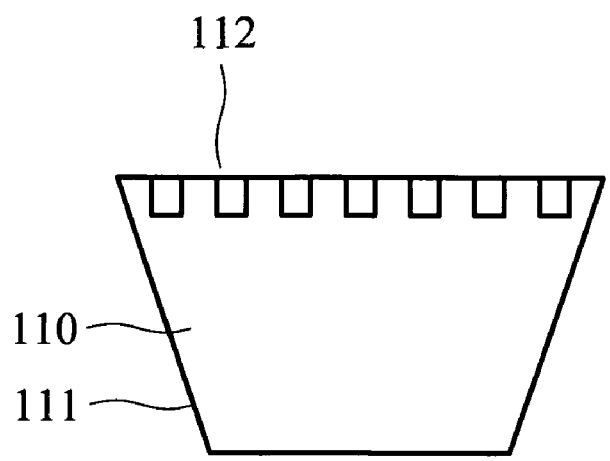
Figure 6F:
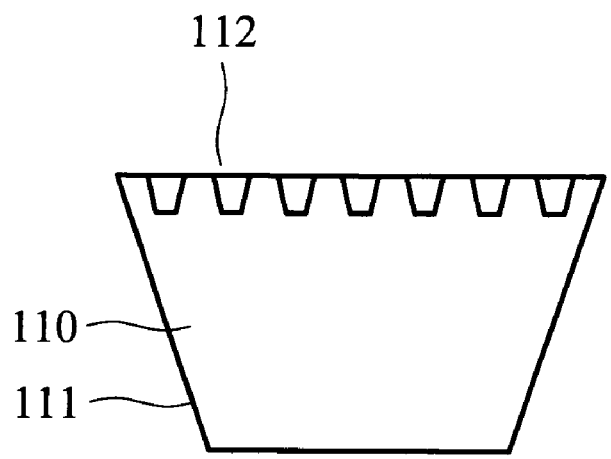
Figure 6G:
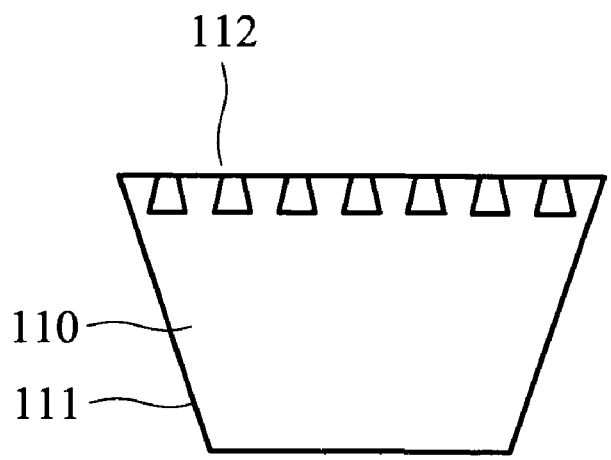
Figure 6H:
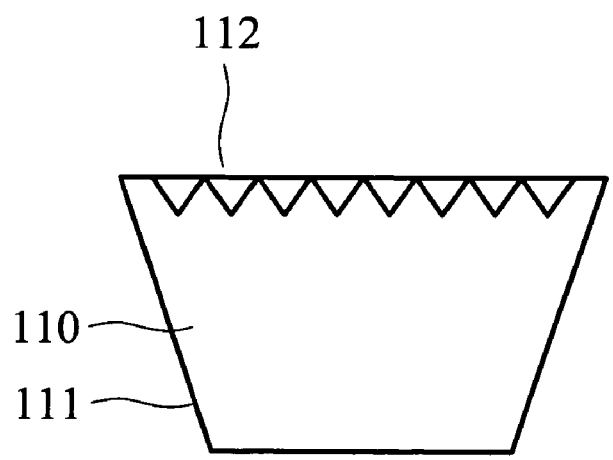

The textured top surface 112 of the AlGaInN thick film 110 comprises convex or concave structure, in a polygon, circle or ellipse. For example, the textured top surface 112 of the AlGaInN thick film 110 in the FIGS. 5A~5D is a triangle convex structure, triangle concave structure, circle convex structure and circle concave structure sequentially. The convex or concave structure is smaller than the LED chip 120 size, preferably about 1 nm~500 μm. The included angle of convex or concave structure bottom and oblique side is vertical or oblique as shown in FIGS. 6A~6H. In FIG. 6A, the convex structure and the bottle of the textured top surface 112 is vertical. In FIG. 6B~6D, the convex structure and the bottle of the textured top surface 112 is oblique. In the FIG. 6E, the concave structure and the bottle of the textured top surface 112 is vertical. In FIG. 6F~6H, the concave structure and the bottle of the textured top surface 112 is oblique. The convex or concave structure is shown periodically, and the show period is less than the LED chip 120 size, preferably about 1 nm~500 μm. The height difference of convex or concave structure must be less than the AlGaInN thick film 110 thickness, or the AlGaInN thick film 110 may be perforated. The height difference of convex or concave structure is from 1 nm to the AlGaInN thick film 110 thickness.

Figure 7A:
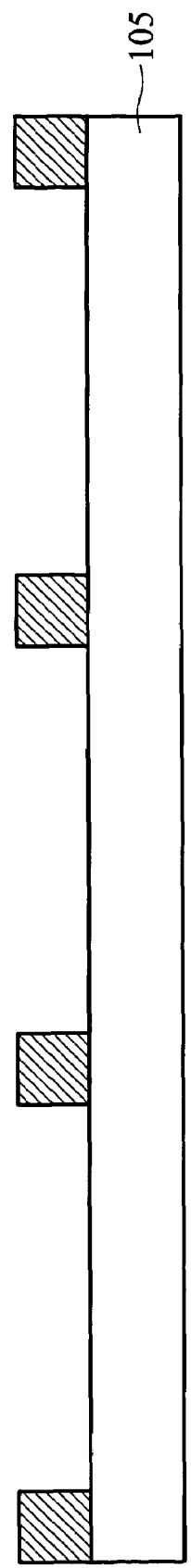
FIGS. 7A~7F are cross-sections of a fabrication method according to the LED of the present invention.
Figure 7B:
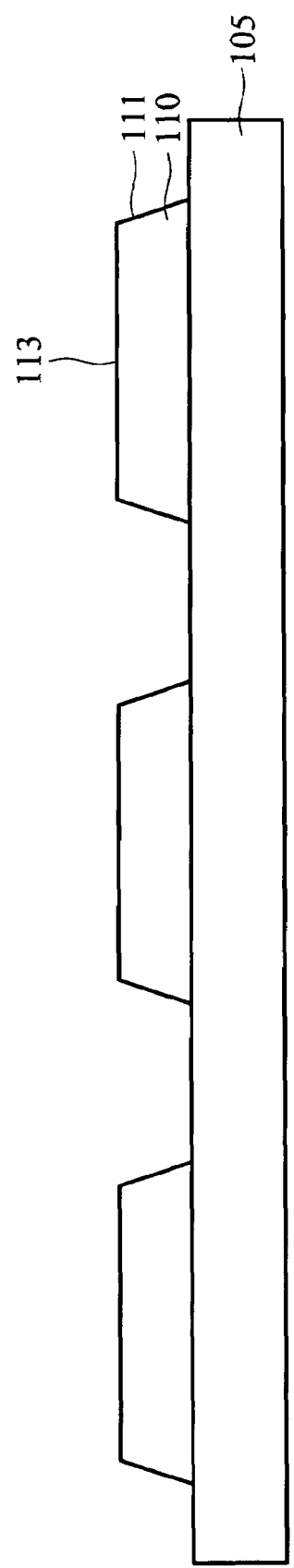

The LED fabrication method of the present invention is shown in FIGS. 7A~7F. First, a first pattern is formed on the substrate 105, as shown in FIG. 7A. AlGaInN thick film 110 with oblique side 111 is formed in the first pattern by epitaxy method, and the AlGaInN thick, film 110 has a first flat surface 113, as shown in FIG. 7B.

Figure 7C:
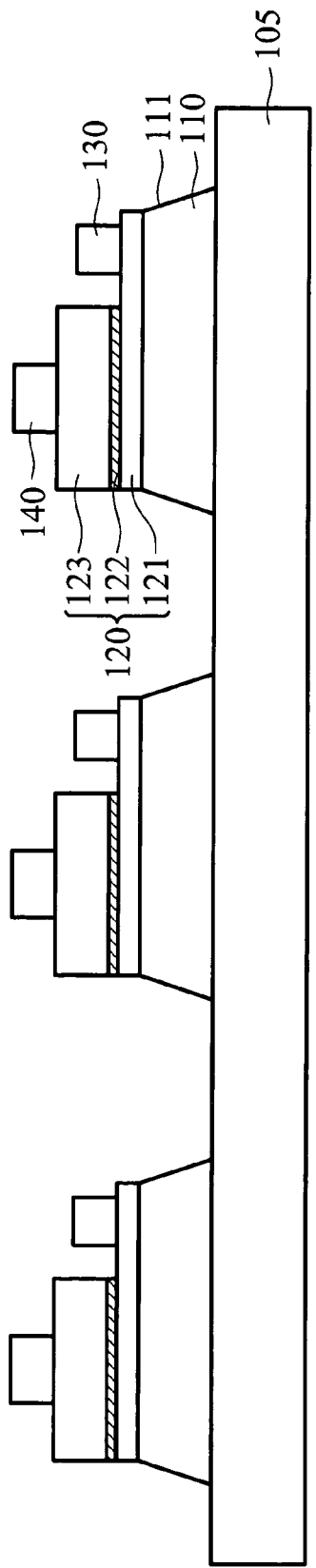

In FIG. 7C, the LED chip 120 is formed on the first flat surface 113 of the AlGaInN thick film 110 by conventional method, such as metal organic chemical vapor deposition (MOCVD). The LED chip 120 comprises n-type semiconductor layer 121, an active layer 122 and a p-type semiconductor layer 123. N-type ohmic contact electrode 130 and p-type ohmic contact electrode 140 are formed on the n-type semiconductor layer 121 and p-type semiconductor layer 123 respectively.

Figure 7D:
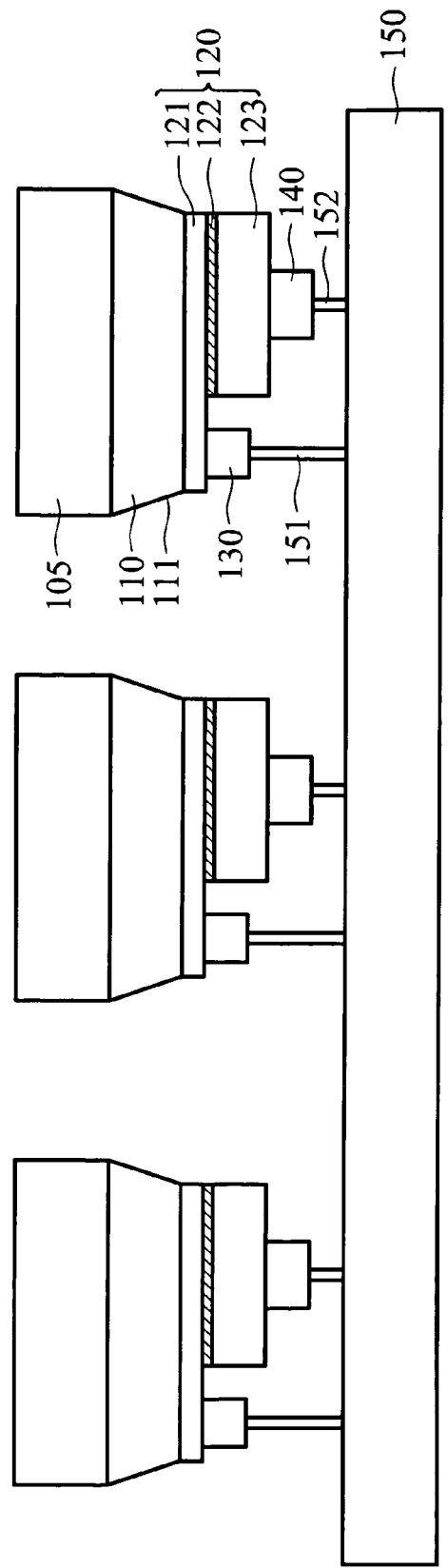

In FIG. 7D, the submount 150 with first bump 151 and second bump 152 is provided. Then the above-mentioned structure is inverted to contact the N-type ohmic contact electrode 130 and first bump 151, p-type ohmic contact electrode 140 second bump 152 respectively.

Figure 10:
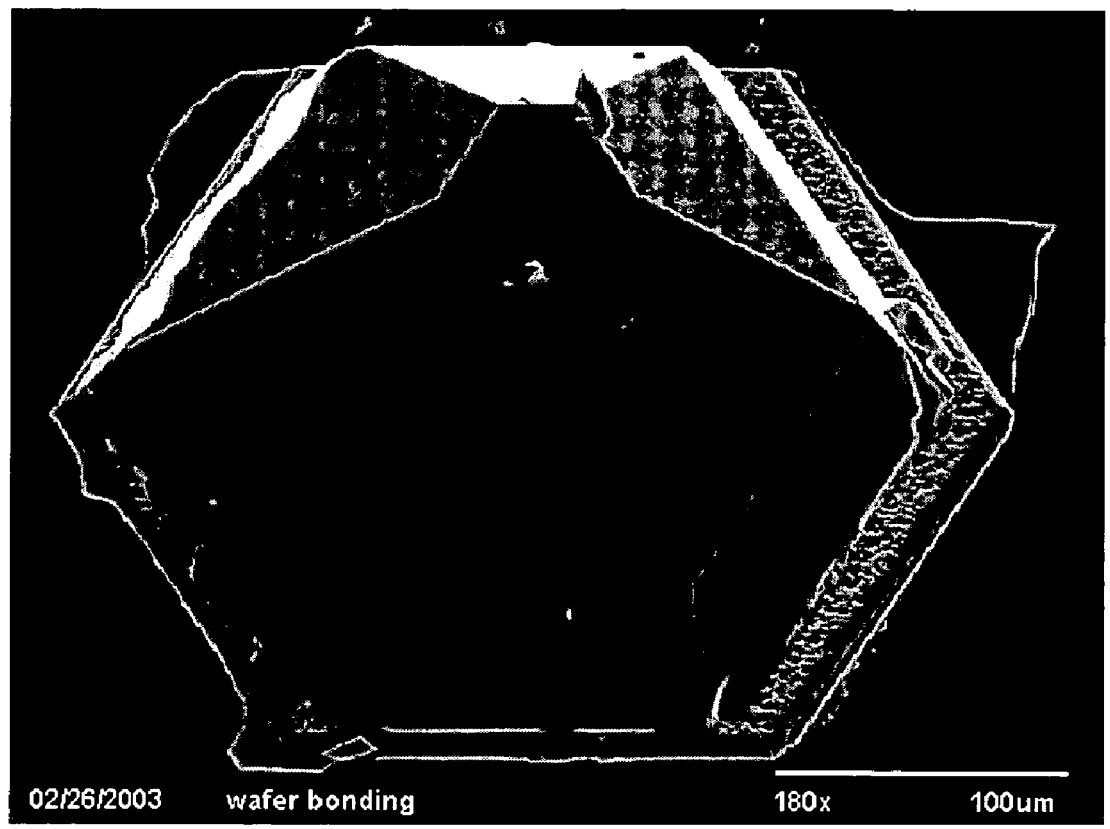
FIG. 10 is a SEM picture of a AlGaInN thick film of the present invention.

FIG. 10 is a SEM picture of the AlGaInN thick film. This AlGaInN thick film is obtained by removing the substrate and inverting the LED to expose the second flat surface, according to FIGS. 7C and 7D. The substrate is removed by laser peeling. In this figure, the bottom shape of the AlGaInN thick film is hexagon.

Figure 7E:
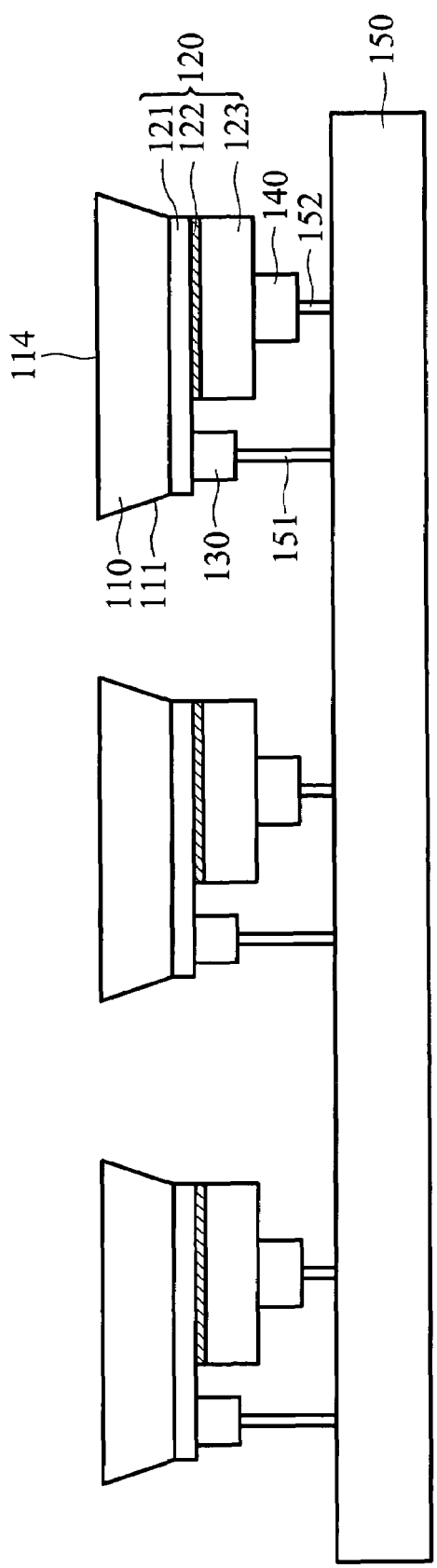
Figure 7F:
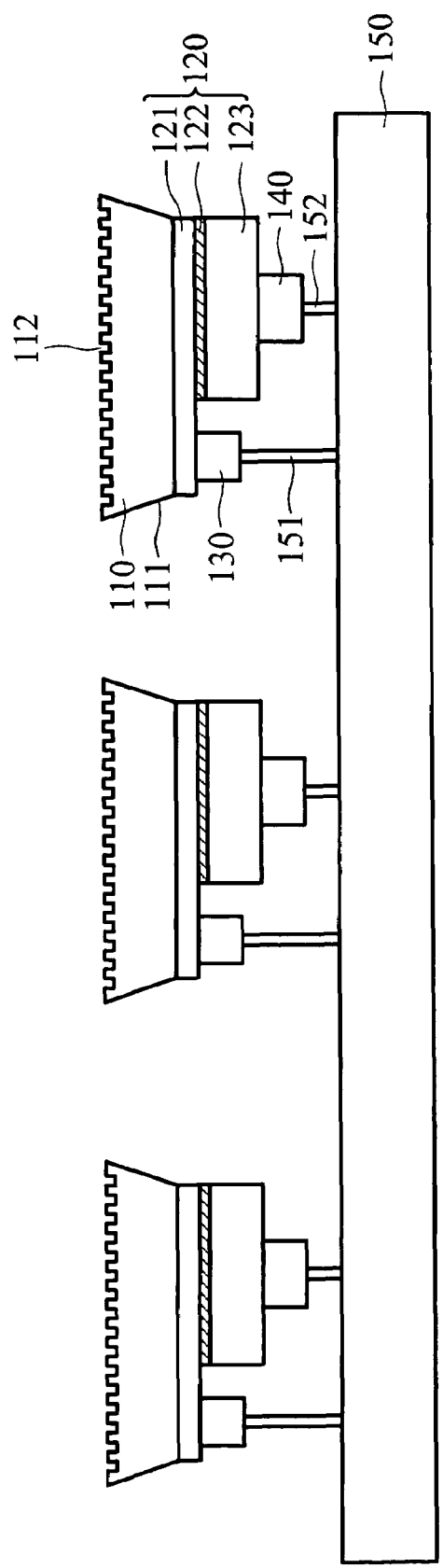

In FIG. 7E, the substrate 105 is removed by laser peeling method, dry etching or wet etching to expose the second flat surface 114 of the AlGaInN thick film 110. Then the second flat surface 114 of the AlGaInN thick film 110 is textured to form textured surface 112, as shown in FIG. 7F.

The substrate 105 comprises sapphire, SiC, silicon, GaAs or AlN. The first pattern formed on the substrate 105 comprises a polygon, circle or ellipse, wherein the polygon comprises a quadrangle or hexagon. The first pattern internal diameter exceeds 150 μm, preferably 200~1000 μm. The AlGaInN thick film 110 formed sequentially is in accord with the first pattern.

Figure 8:
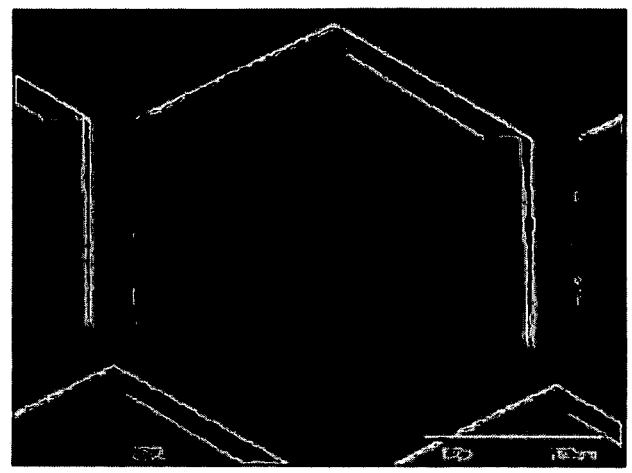
FIG. 8 is a top view of an AlGaInN thick film shape of the present invention.

The AlGaInN thick film 110 is $Al_xGa_{(1-X-Y)}In_YN$ ($0 \leq X$, $Y<1$ and $0 \leq X+Y<1$) thick film and is formed by epitaxy method, such as hydride vapor phase epitaxy (HVPE) method. The oblique side 111 of the AlGaInN thick film 110 is formed naturally by tuning the HVPE condition. The AlGaInN thick film 110 is formed on the first pattern of the substrate 105, thus the shape of the AlGaInN thick film 110 is in accord with the first pattern. For example, if the first pattern is a quadrangle, the shape of the AlGaInN thick film 110 is a truncated inverted pyramid (TIP). If the first pattern is a hexagon, the AlGaInN thick film 110 is formed as FIG. 8. The AlGaInN thick film 110 is thicker than 20 µm, preferably 20~100 µm, and thicker than conventional LED GaN layer, it benefits the sequent surface texture step. The AlGaInN thick film 110 internal diameter is large than 150 µm, preferably 200~1000 µm. The thick film 110 bottom and oblique side is about 43~62°, and the included angle is formed naturally and in accordance with the crystal lattice of the AlGaInN thick film 110.

The texturing second flat surface 114 of the AlGaInN thick film 110 step comprises defining a second pattern (not shown) on the second flat surface 114 by photolithography, electron beam lithography or interference lithography, for example. The second pattern comprises a polygon, a circle or an ellipse, and the second pattern is smaller the LED chip size, such as 1 nm~500 µm. Next, the second pattern is textured by etching or cutting to form a textured surface 112. The textured surface 112 comprises convex or a concave structure as shown in FIGS. 5A~5D. The included angle of convex or concave structure bottom and oblique side is vertical or oblique as shown in FIGS. 6A~6H.

Figure 9:
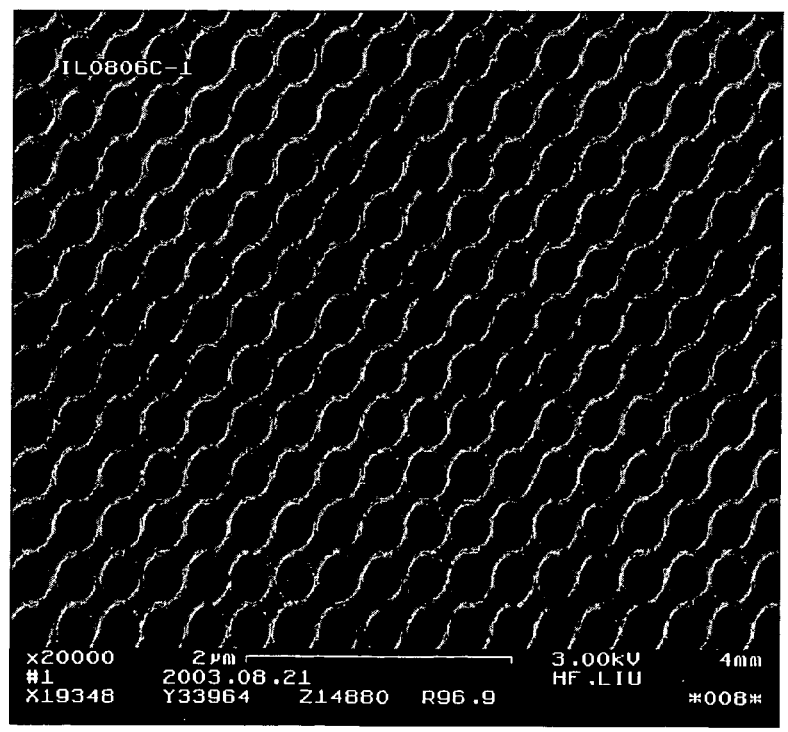
FIG. 9 is a microscopy picture of a textured surface of AlGaInN thick film of the present invention.

FIG. 9 is a microscopy picture of textured surface of AlGaInN thick film. The sample is treated by the interference lithography and reactive ion etching to formed textured surface. The single pattern size of the textured surface is about 300 nm in the period of 330 nm, and the height difference of the single pattern size of the textured surface is about 200 nm. As a result, forming a textured surface in the AlGaInN by the present invention works.

Finally, the submount is cut to obtain a plurality of flip LED with textured surface. The present invention not only simplifies the cutting step, increases yield and low cost, but also reduces heat and increases light emitting performance.

The advantages of the LED and fabrication method thereof of the embodiment comprise:

1. The LED of the embodiment is flip structured and its light emitting position is AlGaInN thick film, thus there is no ohmic contact electrode to cover light. Therefore, LED luminescent efficiency is enhanced.

2. The AlGaInN thick film of the embodiment has oblique side to decrease total internal reflection, thus the LED luminescent efficiency is enhanced.

3. The AlGaInN thick film has textured surface to enhance the LED of the embodiment.

4. The AlGaInN thick film is thicker than the GaN layer thickness of convention LED, thus the possibility of surface texturing perforation is decreased.

5. The hardness of conventional LED GaN layer is too hard to be cut. The oblique side of AlGaInN thick film is formed naturally without cutting step, thus simplifying the cutting step, increase yield and low cost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A light emitting diode (LED), comprising:
   a LED chip comprising a n-type semiconductor layer, an active layer and a p-type semiconductor layer;
   an n-type ohmic contact electrode electrically contacting the n-type semiconductor layer;
   a p-type ohmic contact electrode electrically contacting the p-type semiconductor layer; and
   an AlGaInN thick film on the LED chip, and the AlGaInN thick film has an oblique side and a textured top surface.

2. The light emitting diode (LED) as claimed in claim 1, wherein the AlGaInN thick film is $Al_XGa_{(1-X-Y)}In_YN$ ($0 \leq X$, $Y<1$ and $0 \leq X+Y<1$) thick film.

3. The light emitting diode (LED) as claimed in claim 1, wherein the AlGaInN thick film is thicker than 20 µm.

4. The light emitting diode (LED) as claimed in claim 1, wherein the AlGaInN thick film thickness is about 20~100 µm.

5. The light emitting diode (LED) as claimed in claim 1, wherein the AlGaInN thick film internal diameter exceeds 150 µm.

6. The light emitting diode (LED) as claimed in claim 1, wherein the AlGaInN thick film internal diameter is about 200~1000 µm.

7. The light emitting diode (LED) as claimed in claim 1, wherein the bottom shape of AlGaInN thick film comprises a polygon, a circle or an ellipse.

8. The light emitting diode (LED) as claimed in claim 7, wherein the polygon comprises a quadrangle or a hexagon.

9. The light emitting diode (LED) as claimed in claim 1, wherein the included angle between AlGaInN thick film bottom and oblique side is about 43~62°.

10. The light emitting diode (LED) as claimed in claim 1, wherein the textured top surface comprises a convex structure or a concave structure.

11. The light emitting diode (LED) as claimed in claim 10, wherein the shape of convex structure or concave structure comprises a polygon, a circle or an ellipse.

12. The light emitting diode (LED) as claimed in claim 10, wherein the shape size of convex structure or concave structure is smaller than the LED chip size.

13. The light emitting diode (LED) as claimed in claim 12, wherein the shape size of convex structure or concave structure is about 1 nm~500 µm.

14. The light emitting diode (LED) as claimed in claim 10, wherein the convex structure or the concave structure has a sidewall vertical or oblique to its bottom.

15. The light emitting diode (LED) as claimed in claim 10, wherein the convex structure or the concave structure is a matrix.

16. The light emitting diode (LED) as claimed in claim 15, wherein the period of matrix is smaller than the LED chip size.

17. The light emitting diode (LED) as claimed in claim 16, wherein the period is about 1 nm~500 µm.

18. The light emitting diode (LED) as claimed in claim 10, wherein the height difference of convex structure or concave structure is less than the AlGaInN thick film thickness.

19. The light emitting diode (LED) as claimed in claim 10, wherein the height difference of convex structure or concave structure is from 1 nm to the AlGaInN thick film thickness.

* * * * *